United States Patent [19]
Yoder

[11] Patent Number: 5,773,933
[45] Date of Patent: Jun. 30, 1998

[54] BROADBAND TRAVELING WAVE AMPLIFIER WITH AN INPUT STRIPLINE CATHODE AND AN OUTPUT STRIPLINE ANODE

[75] Inventor: Max N. Yoder, Falls Church, Va.

[73] Assignee: The United States of America as represented by the Secretary of the Navy, Washington, D.C.

[21] Appl. No.: 623,757

[22] Filed: Mar. 29, 1996

[51] Int. Cl.$^6$ ........................................... H03F 5/00
[52] U.S. Cl. ............................ 315/3; 315/5.37; 313/311; 330/43; 257/10
[58] Field of Search ............................ 315/3, 5.37, 349; 313/308, 311; 330/43, 44; 257/10

[56] References Cited

U.S. PATENT DOCUMENTS

| | | | |
|---|---|---|---|
| 3,725,803 | 4/1973 | Yoder | 315/3 X |
| 3,732,456 | 5/1973 | Buck | 315/3 |
| 3,913,025 | 10/1975 | Zinn | 330/44 X |
| 4,350,993 | 9/1982 | Wieder | 315/3 |
| 4,967,162 | 10/1990 | Barnett et al. | 330/43 |
| 5,124,664 | 6/1992 | Cade et al. | 330/43 X |
| 5,334,853 | 8/1994 | Yoder | 257/10 |
| 5,548,185 | 8/1996 | Kumer et al. | 313/308 X |
| 5,592,053 | 1/1997 | Fox et al. | 315/3 |

*Primary Examiner*—Robert Pascal
*Assistant Examiner*—Justin P. Bettendorf
*Attorney, Agent, or Firm*—Thomas E. McDonald; John G. Wynn; William E. McCarthy

[57] ABSTRACT

A broadband, traveling wave amplifier which includes a target anode and an electron gun for bombarding the anode with an electron beam having an amplitude proportional to that of an input signal. The electron gun includes a NEA semiconductor cold cathode having an electron emitting surface and a modulation structure for modulating the emitted electron beam with an input signal to be amplified. The electron gun and the anode are configured as parallel strip transmission lines having the same phase velocity. The target anode may be a reversed-biased stripline diode, Schottky barrier stripline diode, or metal/semiconductor/metal stripline structure.

20 Claims, 9 Drawing Sheets

BROADBAND TRAVELING WAVE AMPLIFIER WITH AN INPUT STRIPLINE CATHODE AND AN OUTPUT STRIPLINE ANODE

TECHNICAL FIELD

The invention relates generally to high power, broadband, amplifiers, and, in particular, to a traveling wave amplifier having an NEA cold cathode.

BACKGROUND ART

The microwave and millimeter wave bands are widely used by the U.S. Department of Defense. Electronic Warfare systems and Low Probability Of Intercept Radar systems require the use of instantaneous bandwidths measured in decades. Amplification of signals over octaves and even decades of instantaneous bandwidth are comparatively easy to achieve with solid state distributed amplifiers, such as described in U.S. Pat. Nos. 4,947,220 and 4,929,986 to Max N. Yoder, or U.S. Pat. No. 4,914,743 to Yoder et al. However, these amplifiers either are not capable of delivering more than five watts output power or are not very efficient. Consequently, most high power microwave and millimeter wave amplifiers in use today are based on vacuum tubes. Not only are they bulky, but their operating life is primarily based on the lifetime of the cathode. This cathode typically exhibits an operating lifetime controlled by the equation:

$$\text{amperes} \times \text{hours} = \text{constant}.$$

About 20 years ago, an approach was made to overcome the limitations imposed by the above equation by building a hybrid semiconductor/vacuum tube device known as an Electron Beam Semiconductor (EBS) or Gun, Electron Injection for Semiconductor Hybrid Amplification (GEISHA). These devices reduced the current requirements for the cathodes by a factor of several thousand and thereby increased operating life. Various EBS/GEISHA devices are described in U.S. Pat. No. 3,749,961 to Bates et al, U.S. Pat. No. 3,893,157 to Silzars et al, U.S. Pat. No. 4,263,531 to Yoder, and U.S. Pat. No. 4,328,466 to Norris, Jr. et al. In these devices electrons are accelerated from a cathode to at least one reverse-biased semiconductor diode target. Each target in the typical EBS/GEISHA manner operates such that any single high energy electron impinging upon it and penetrating deeply in the depletion region of the semiconductor will create many electron-hole pairs thus rendering the previously depleted region conductive and thereby creating a current in a load resistor. Current gain ensues that is proportional to the accelerating voltage and inversely proportional to the target semiconductor bandgap, typically several thousand. Voltage gain in these devices is typically finite, but small, the limitation on voltage gain being the reverse voltage sustainable by the silicon power diode anode.

Also, these EBS/GEISHA devices could be configured into class B, push pull amplifiers wherein linearity and efficiency were substantially improved, as described in the above-referenced U.S. Pat. Nos. 3,749,961 and 4,328,466.

These EBS/GEISHA devices required very complex deflection structures for deflection-modulating rectangularly-shaped, laminar flow electron beams of up to 10" in length, in a traveling wave manner. Unfortunately, the deflection structure was required to synchronize its phase velocity in one direction with the velocity of the electrons and its phase velocity in an orthogonal direction with the phase velocity of the strip transmission line, reverse-biased anode target. This was never successfully accomplished for large bandwidth devices. The expense of such devices rendered them non-competitive, and their development and marketing ceased.

DOD satellite life is still primarily determined by the conditions imposed in the above formula. The linearity of high power microwave and millimeter wave broadband amplifiers remains much less than desirable. The efficiency of high power microwave and millimeter wave broadband amplifiers remains less than 50% and their operating lifetime for terrestrial applications is generally less than 10,000 hours. No devices of any kind (either solid state or vacuum tube) currently exist wherein high gain, extremely broadband operation, high linearity, and efficiency greater than 60% can be obtained simultaneously. Because of this limitation, multi-functional electromagnetic systems capable of simultaneously processing many microwave signals have not been viable.

More recently, EBS/GEISHA devices have been proposed based on the use of semiconducting diamond anode targets. Other concepts have been floated in the diamond community based on the negative electron affinity (NEA) properties of diamond. These concepts are generally based on a variation of the circuit shown in FIG. 1, which includes a cathode 10, a semiconducting diamond target anode 12, and a first d. c. voltage source 14 connected between the cathode 10 and the diamond target 12, to cause electrons emitted from the cathode 10 to be accelerated toward the diamond target 12. A source 16 of a varying voltage signal to be amplified is connected between a control grid 18 and the cathode 10, to modulate the flow of electrons from the cathode 10 to the diamond target 12. In the diamond target 12, the electron current is multiplied in the manner of earlier silicon EBS targets, but since diamond has a NEA characteristic, the multiplied electrons are emitted into a vacuum and collected at a metal anode plate 20, which is maintained at a positive voltage relative to the diamond target 12 by a second d.c. voltage source 22. The electron collection process is similar to that of a conventional vacuum tube amplifier. Still other variations of this process employ a NEA diamond cathode as the initial electron source. These recent EBS/GEISHA designs, however, retain earlier problems. While increased output power is obtainable, there still remains the problem of a complex laminar flow, rectangularly shaped electron beam and its traveling wave deflection structure.

U.S. Pat. No. 5,334,853 describes a semiconductor cold cathode devices in which forward biased heterojunctions formed of N-type NEA semiconductor AlN or an N-type NEA semiconductor mixture of AlN and a very thin (less than 100 nanometers thick) layer of P-type semiconductor SiC or an P-type NEA semiconductor mixture of SiC and AlN, in which electrons are monoenergetically emitted from the P-type semiconductor material. The metallic ohmic contact for the P-type semiconductor material may be formed as a metallic grid so that the density of electrons emitted from the P-type material may be modulated by modulating the applied voltage.

U.S. patent application Ser. No. 08/779,586 of Max N. Yoder describes an injection cold cathode which includes a heterojunction formed of a layer of N+ doped cBN, a NEA semiconductor material having a wide, indirect bandgap, and a thin layer of n-type AlN, a NEA semiconductor material having a smaller, direct bandgap. The heterojunction is forward biased by an adjustable voltage source. Electrons which are ballistically injected from the wider indirect bandgap cBN material into the smaller direct bandgap AlN material, transit the AlN material with little scattering and recombination and are monoenergetically emitted from the NEA surface of the AlN material into the ambient vacuum. The energy of the emitted electrons can be adjusted by adjusting the electrical bias between the N+ cBN material and the n-type AlN material.

SUMMARY OF THE INVENTION

It is a primary object of the invention to provide an amplifier having an instantaneous bandwidth extending from the audio spectrum into the millimeter wave spectrum.

It is a further object of the invention to provide such a broadband amplifier which also has exceptionally good linearity, in which the cross modulation and intermodulation products are more than 28 dB below the fundamental signals output.

It is a still further object of the invention to provide such a broadband linear amplifier having a large voltage gain as well as a large current gain.

These and other objects of the invention are achieved by a EBS/GEISHA device, in which a target anode is bombarded with an electron beam having an amplitude directly proportional to the amplitude of an input signal to be amplified. The modulated electron beam is generated by a cold cathode which includes at least one NEA semiconductor material and a modulation structure for modulating the electron beam with the input signal.

The cold cathode and the target anode are configured as spaced apart, parallel, coextending strip transmission lines, in which an electron emitting surface of the cathode faces an electron bombarded surface of the anode, and the electron beam is modulated by applying the input signal to an electrically conductive grid or screen disposed over the electron emitting surface, the two transmission lines being designed such that the anode strip transmission line exhibits a phase velocity equal to the phase velocity of the cold cathode strip transmission line.

In a preferred embodiment of the invention, the anode strip transmission line is a reversed-biased diode of wide bandgap semiconductor material having a very high reverse bias voltage capability, relative to the voltage of the input signal to be amplified. The application of a high reverse-bias voltage across the anode diode increases the voltage gain of the amplifier.

DESCRIPTION OF PREFERRED EMBODIMENTS

The unique properties of high bandgap semiconductors (I.e., semiconductors having bandgaps greater than 5.4 eV) enable the realization of a simple approach to simultaneously achieving very linear, very efficient, extremely broadband, high power amplification of signals from the audio to the millimeter wave spectrum.

Diamond and most other high bandgap semiconductors exhibit NEA. Moreover, and unlike virtually all other cathodes, they are not subject to the operating lifetime constraints noted in the equation above. Also unlike other cathodes that are "poisoned" and rendered inoperable when exposed to ambient pressures above about $10^{-7}$ Torr, NEA cathodes may be exposed to air at atmospheric pressure, exposed to atomic hydrogen, or even immersed in water and continue to operate when placed back in the vacuum. Their robust nature is believed to derive from the strength of the chemical bonds on their surfaces. In the case of hydrogen-terminated diamond NEA cathodes, there are virtually no known potential contaminants (fluorine excepted) that bond stronger to diamond than does hydrogen and thus there are no poisoning effects encountered. Other NEA cathodes have similarly strong chemical bonds and virtually any other impurity atoms alighting on their cold surface will not chemisorb thereto.

Figure 1:
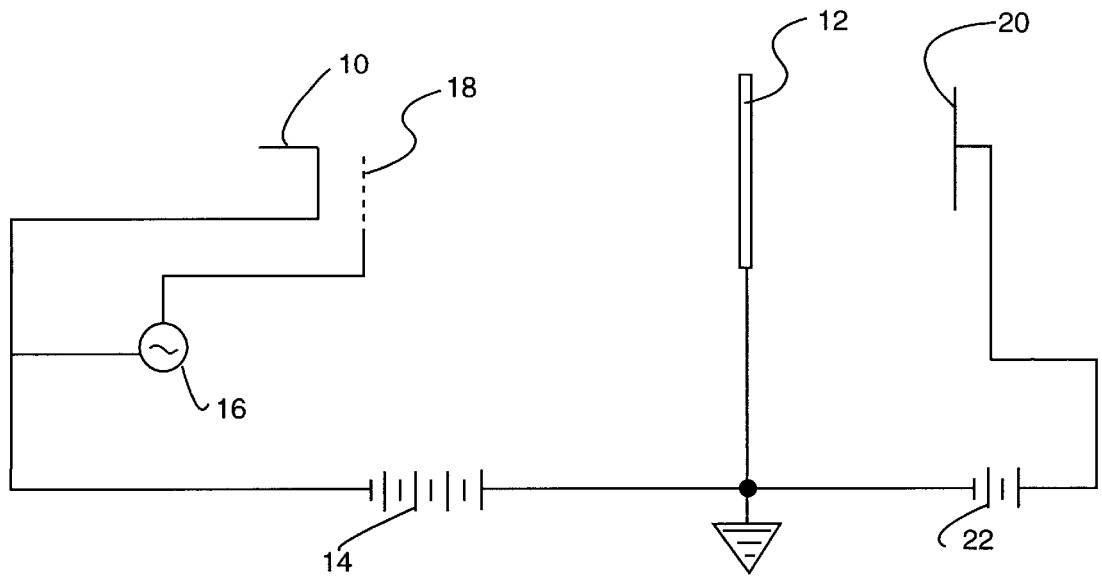
FIG. 1 is a basic electrical schematic for a known EBS/GEISHA device having an NEA diamond target anode.
Figure 2:
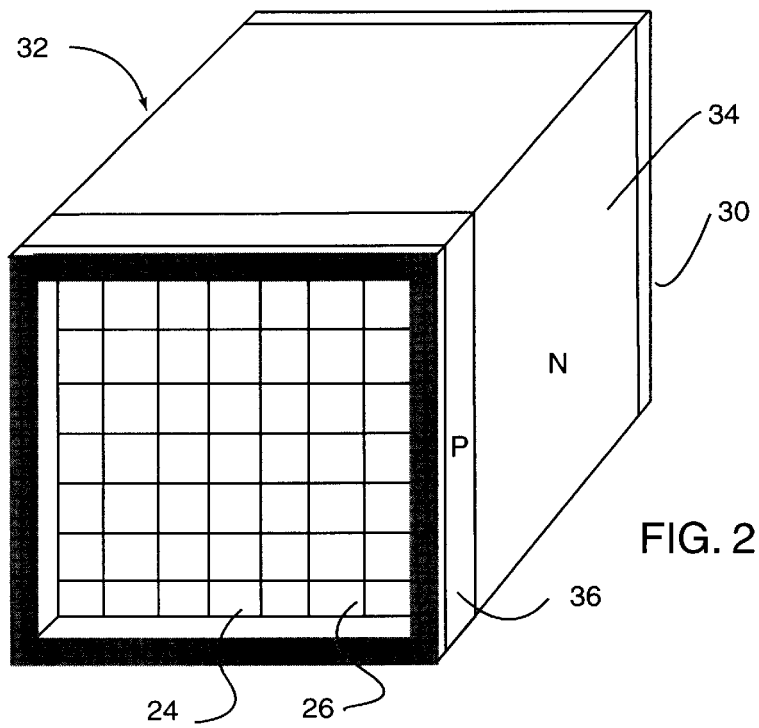
FIGS. 2–4 show various NEA semiconductor cold cathodes which can be modified for use as an electron gun in a GEISHA traveling wave amplifier.
Figure 3:
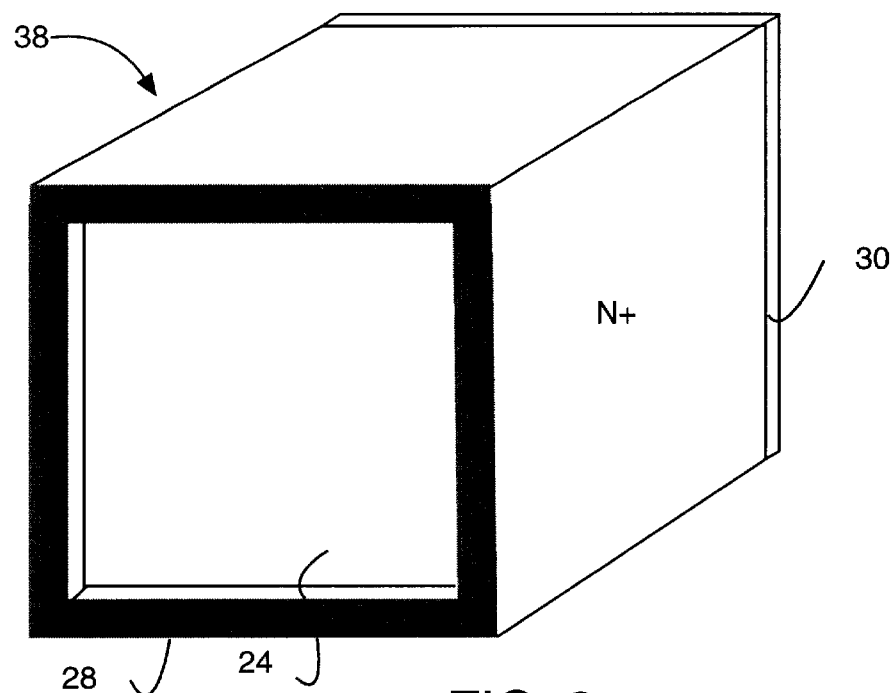
Figure 4:
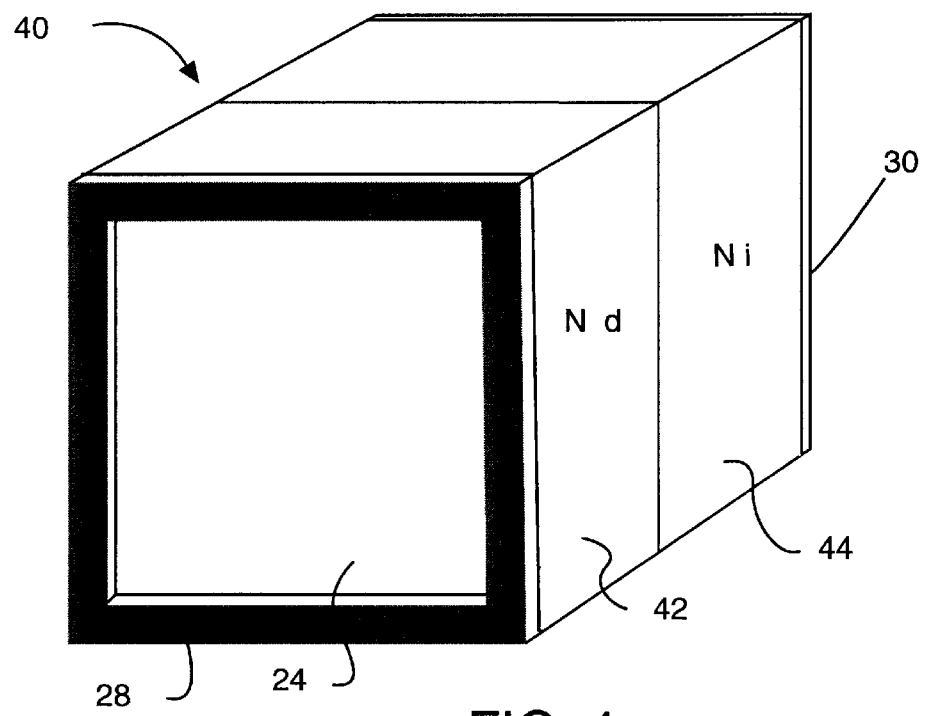

Each of the various NEA semiconductor cold cathodes, shown in FIGS. 2–4, includes an electron emitting surface 24 on one side of the device, a first ohmic contact 26 or 28 on the electron emitting surface 24, and a second ohmic contact 30 on the side of the device opposite the emitting surface 24. Emission of electrons from the surface 24 into the ambient vacuum is initiated and maintained by applying and maintaining a voltage to the first ohmic contact 26 or 28 which is positive relative to the voltage of the second ohmic contact 30.

The NEA semiconductor cold cathode 32 shown in FIG. 2 is a metal-gridded, forward-biased, P-N junction of a N-type, NEA semiconductor layer 34 and a thin, P-type semiconductor layer 36, in which the first ohmic contact 26 is a metallic grid structure deposited on the electron emitting surface 24, such as that described in the above-referenced U.S. Pat. No. 5,334,853, and the second ohmic contact 30 is a metallic layer deposited on the opposite side of the device 32.

The device 32 may be a heterojunction in which the P-type semiconductor layer 36 has a forbidden gap which lies completely within the range of the forbidden gap of the N-type NEA semiconductor layer 34 and is sufficiently thin so that electrons injected from the N-type NEA semiconductor layer 34 ballistically transit the P-type semiconductor layer 36, as described in U.S. Pat. No. 5,334,853. For example, the N-type, NEA semiconductor layer 34 may be a layer of N-type AlN and the thin, P-type semiconductor layer 36 may be a layer of P-type SiC, less than 100 nanometers thick, as also described in U.S. Pat. No. 5,334,853 Alternatively, the device 32 may be a homojunction in which the N-type semiconductor layer 34 and the thin P-type semiconductor layer 36 are formed of the same NEA semiconductor material. For example, the device 32 may be a diamond cathode, in which the N-type diamond layer 34 is impurity doped with phosphorous or degenerately "implantation-doped" with carbon, and the P-type diamond layer is less than 20 nanometers thick and impurity doped with boron. Such a diamond cathode is known to emit electrons when it is forward biased. However, without the forward bias, and in the absence of above-bandgap light, there is no electron emission.

When either type of device 32 is utilized as the electron gun of a EBS/GEISHA amplifier, the signal to be amplified can be applied to the metallic control grid 26 to modulate the density of the electrons emitted from the surface 24.

Some NEA semiconductors such as aluminum nitride (AlN) and gallium aluminum nitride (GaAlN) can be N+ type impurity doped to high concentrations with donors such as germanium. Such N+ type NEA semiconductor materials can be used to form the N+ type NEA semiconductor cathode 38 shown in FIG. 3. The first ohmic contact 28 for the cathode 38 be may of simpler construction than the first ohmic contact 26 for the cathode 32. For example, the periphery of the electron emitting surface 24 may be metallized to form the first ohmic contact 28. When the cathode 38 is utilized as the electron gun of an EBS/GEISHA amplifier, the signal to be amplified is applied to an electrically-conductive control grid or screen (not shown) overlying the electron emitting surface 24.

In the two layer structure 40 shown in FIG. 4, a large bandgap NEA semiconductor material 42 exhibiting an indirect bandgap (e.g., boron nitride) injects electrons into a direct bandgap NEA material 44(e.g., AlN). In such a configuration, the electron scattering is minimal and the electrons can be ejected from the cathode surface with additional energy (velocity). This type of cold cathode is described in detail in the above-referenced U.S. patent application 08/779,586, incorporated herein by reference. The device 40 utilizes the same peripheral first ohmic contact 28 as that of the cathode 38, i.e., the metallized periphery of the electron emitting surface 24. When the device 40 is utilized as the electron gun of an EBS/GEISHA amplifier, the signal to be amplified is applied to an electrically-conductive control grid or screen (not shown) overlying the electron emitting surface 24.

Additional improvements to electron guns derived from NEA cathodes include the introduction of a screen grid at a location between the control grid and the anode to reduce feedback capacitance. Many combinations of these basic structures are possible. In the III-N materials, donors are provided with impurities of germanium, silicon, hydrogen, sulfur or nitrogen vacancies. Acceptors are provided by zinc, magnesium, or beryllium.

Figure 5:
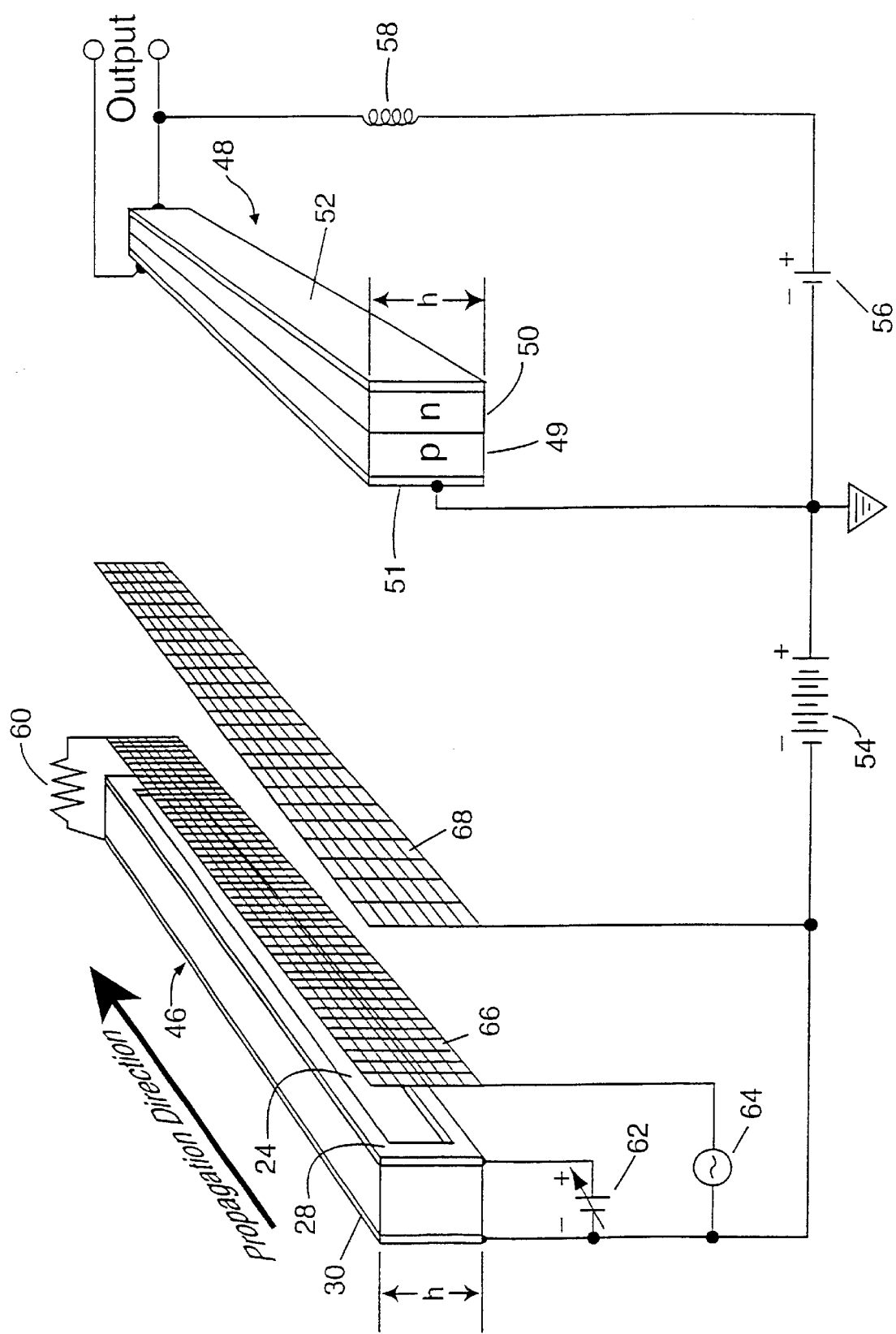
FIG. 5 is a schematic diagram of a GEISHA traveling wave amplifier, according to the invention, having a NEA semiconductor cathode strip transmission line (stripline) and a reverse-biased P-N junction anode stripline.

The basic principles of a traveling wave cathode and electron gun GEISHA device are shown in FIG. 5. Here, an NEA semiconductor cathode 46, such as that illustrated in FIG. 3 or FIG. 4, is configured as a strip transmission line and the reverse biased semiconductor P-N junction anode 48 of the EBS/GEISHA device is also configured as a strip transmission line.

The stripline anode 48 includes a P-type semiconductor layer 49, an N-type semiconductor layer 50, and ohmic contacts 51, 52. The ohmic contact 51 is a very thin metallic layer deposited on an outer surface of the P-type layer 49 bombarded by electrons emitted by the stripline cathode 46. While the layer 51 improves the stripline efficiency, it must be very thin to minimize any reduction in the energy of the electrons passing through the layer 51 and bombarding the P-type semiconductor layer 49.

In order to prevent undesirable moding in the output signal, the maximum cross-sectional dimension h of both the stripline cathode 46 and the stripline anode 48, orthogonal to both the traveling wave propagation direction and the direction of electron flow from the stripline cathode 46 to the stripline anode 48, must be less than one-tenth the wavelength of the highest frequency intended for its operation.

The characteristic impedances and the propagation velocities of the stripline cathode 46 and the stripline anode 48 may be calculated according to well-known principles, formulas, and charts used for that purpose. Such calculations may be found in publications such as "Stripline Circuit Design", by Harlan Howe, Jr., published by ARTECH House, Dedham Mass. in 1974.

The important design characteristic is that the velocity of propagation along the stripline cathode 46 must be equal to that of the propagation velocity along the stripline anode 48. It is important to note that this traveling wave electron gun is only possible with an NEA type cold cathode. A cathode composed of an array of field emitter tips requires much too large of an electric field. When a traveling wave electron gun structure is designed, it becomes apparent that the grid-to-cathode surface is about 1000 times closer in the field emitter design than in the NEA design for equal transconductance. This close spacing causes increased input signal losses thereby preventing the propagation of the input signal to the end of the cathode structure. When compared to a bipolar transistor structure, the injection efficiency of this device is orders of magnitude better and there is no possibility of thermal run away. When compared to any type of transistor, the intrinsic advantage of the GEISHA is that the Miller feedback capacitance is virtually eliminated. (For very compact designs, a screen grid can further reduce this adverse effect.) As such, the performance of the GEISHA device falls off as $1/f$ (where f is frequency) as compared to $1/f^2$ in transistors. Because of loss tangents and impedance considerations, a traveling wave structure has never proven practical in a transistor; in the traveling wave GEISHA illustrated in FIG. 5, this is no longer a problem.

In addition to the traveling wave cathode and anode structures 46, 48, voltage supply 54 supplies the acceleration voltage (typically about 20,000 volts) to create the electron-hole pairs in the stripline anode 48, voltage supply 56 supplies the stripline anode 48 reverse bias potential (typically a few hundred volts), 58 is an inductor of a size large enough such that its impedance at the lowest frequency of operation is about 10 times that of the output impedance of the device and terminating (reflection suppressing) resistor 60 is the same value as the characteristic impedance of the traveling wave stripline cathode 46.

Like the cathodes of FIGS. 3 and 4, traveling wave stripline cathode 46 includes an electron emitting surface 24, a first ohmic contact 28 extending about the periphery of the electron emitting surface 24, and a second ohmic contact 30 on the side of the cathode 46 opposite the electron emitting surface 24. In the stripline cathode 46, the maximum width of the electron emitting surface 24 is less than 0.1 wavelength of the highest frequency intended for its operation. The energy of the emitted electrons can be adjusted by adjusting the variable direct voltage supply 62 connected between the first and second ohmic contacts 28, 30 of the stripline cathode 46. The alternating signal 64 to be amplified is applied to a control grid 66 overlying the electron emitting surface 24 of the stripline cathode 46. Also, a suppressor grid 68 may be disposed between the control grid 66 and the stripline anode 48 to reduce feedback capacitance.

Figure 6:
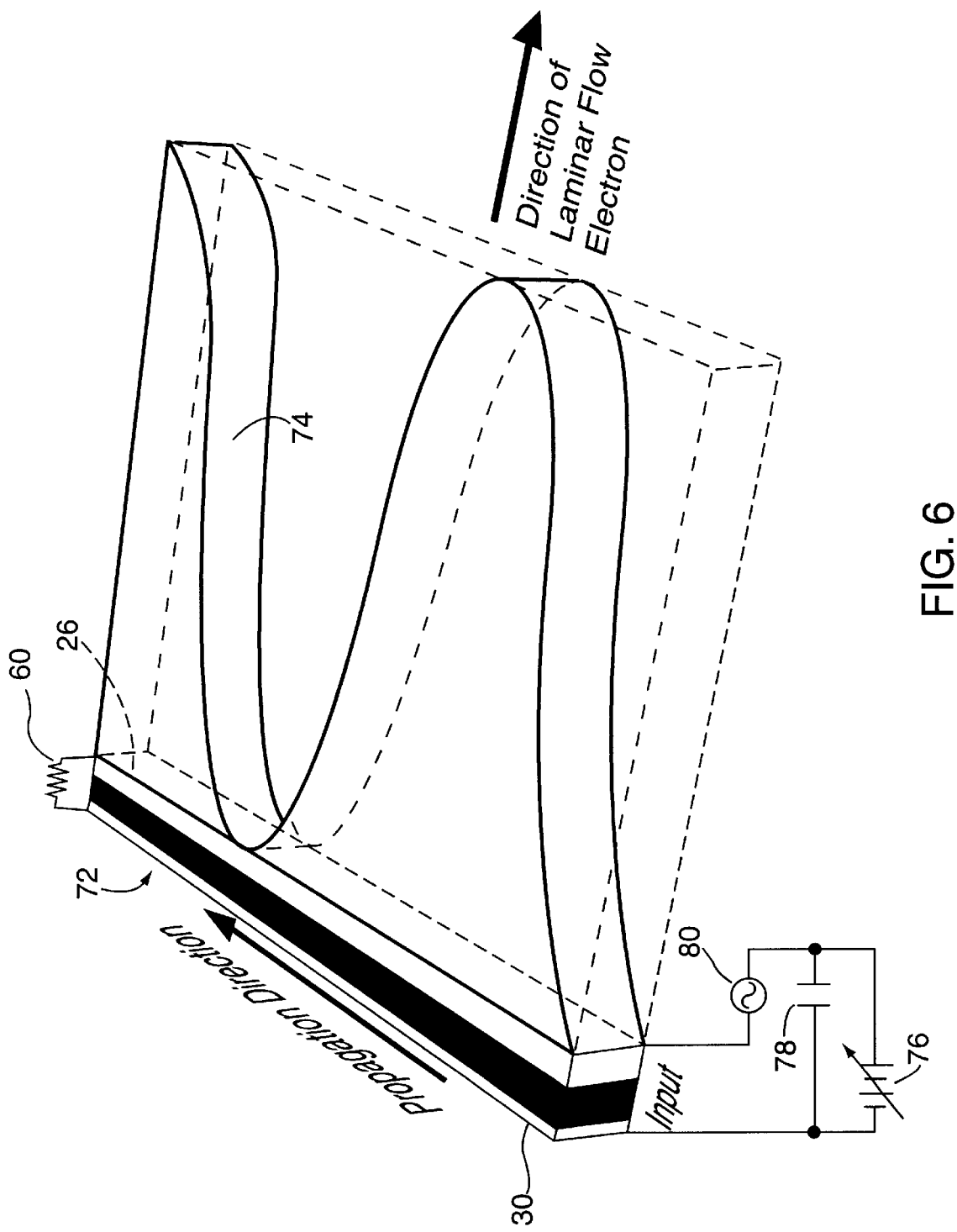
FIG. 6 is a schematic diagram showing the NEA semiconductor cathode stripline of FIG. 5 and the resultant electron beam for 100% modulation and class A operation.

A variation is shown in FIG. 6. Here the cathode 72 is of the type shown in FIG. 2, but it could have just as well been that of FIG. 3 or FIG. 4. The traveling wave modulation pattern of the electron magnitude 74 is also shown here. The spacing of the periodicity of the undulations in the magnitude 74 of the sheet electron beam emitted is dependent on frequency and on the propagation velocity along the traveling wave stripline cathode 72. Depending on the instantaneous polarity and magnitude of the input signal, certain portions of the stripline cathode 72 will be forward biased (on) while other incremental portions will be reverse biased (off). The resultant electron beam is shown in FIG. 6 with this modulation effect shown for the case of 100% modulation for class A operation. In the case of the stripline P-N junction NEA cathode 72, an adjustable d.c. bias voltage source 76 and an RF bypass capacitor 78 is inserted in series with the alternating current signal 80 between the metallic grid ohmic contact 26 and the ohmic contact 30, as shown in FIG. 6. The separation between the on and the off portions of the stripline anode (not shown) will depend on the frequency of the input signal 80 and the propagation velocity of the stripline anode (which is identical to that along the stripline cathode 72). For the stripline cathode 72, the stripline velocity depends on the dielectric constant of the semiconductor used, the doping density and its gradient in the semiconductor, and the applied diode bias.

Figure 7:
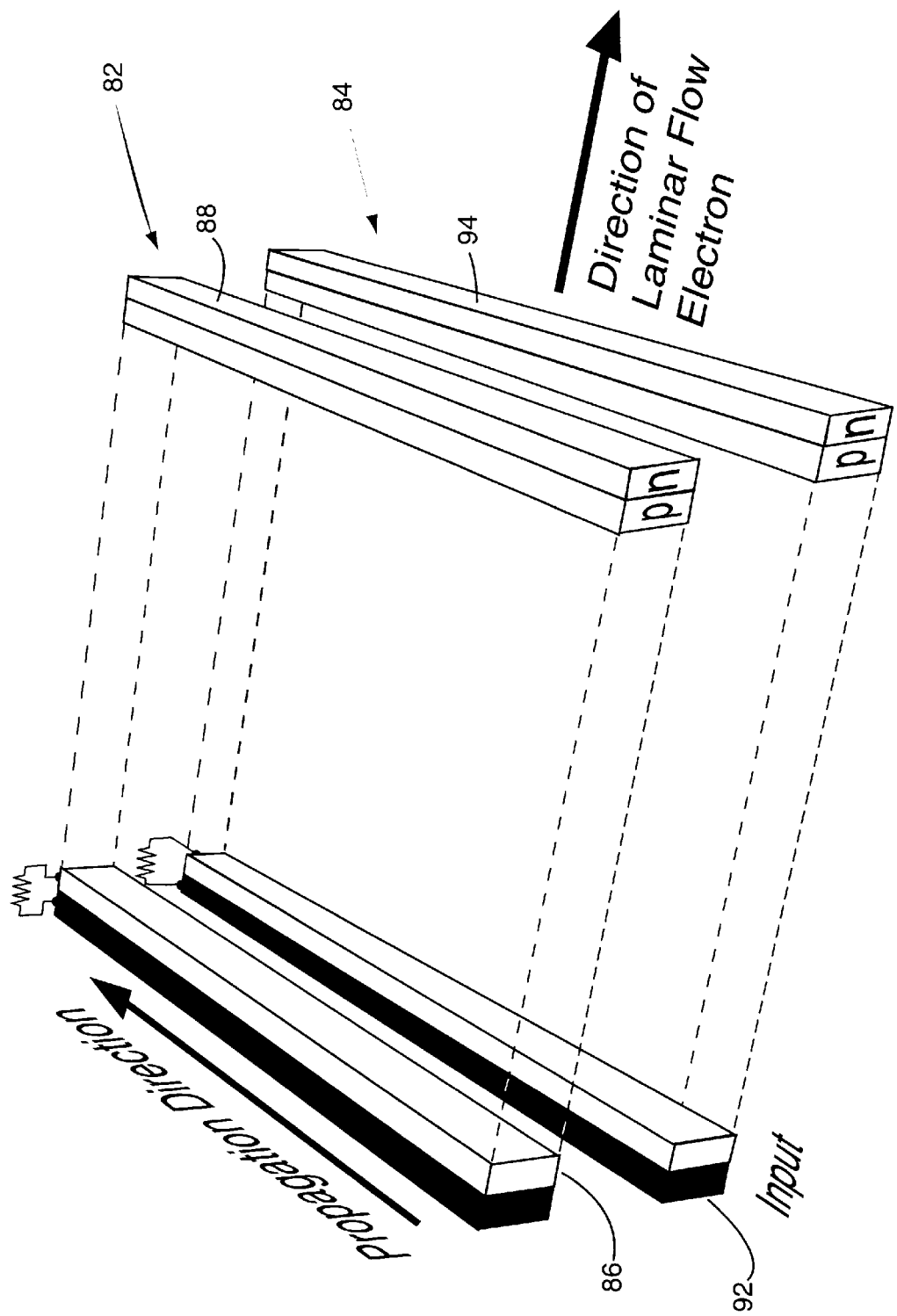
FIG. 7 shows a pair of the GEISHA traveling wave amplifiers of FIGS. 5 and 6, disposed parallel to each other, according to the invention.
Figure 9:
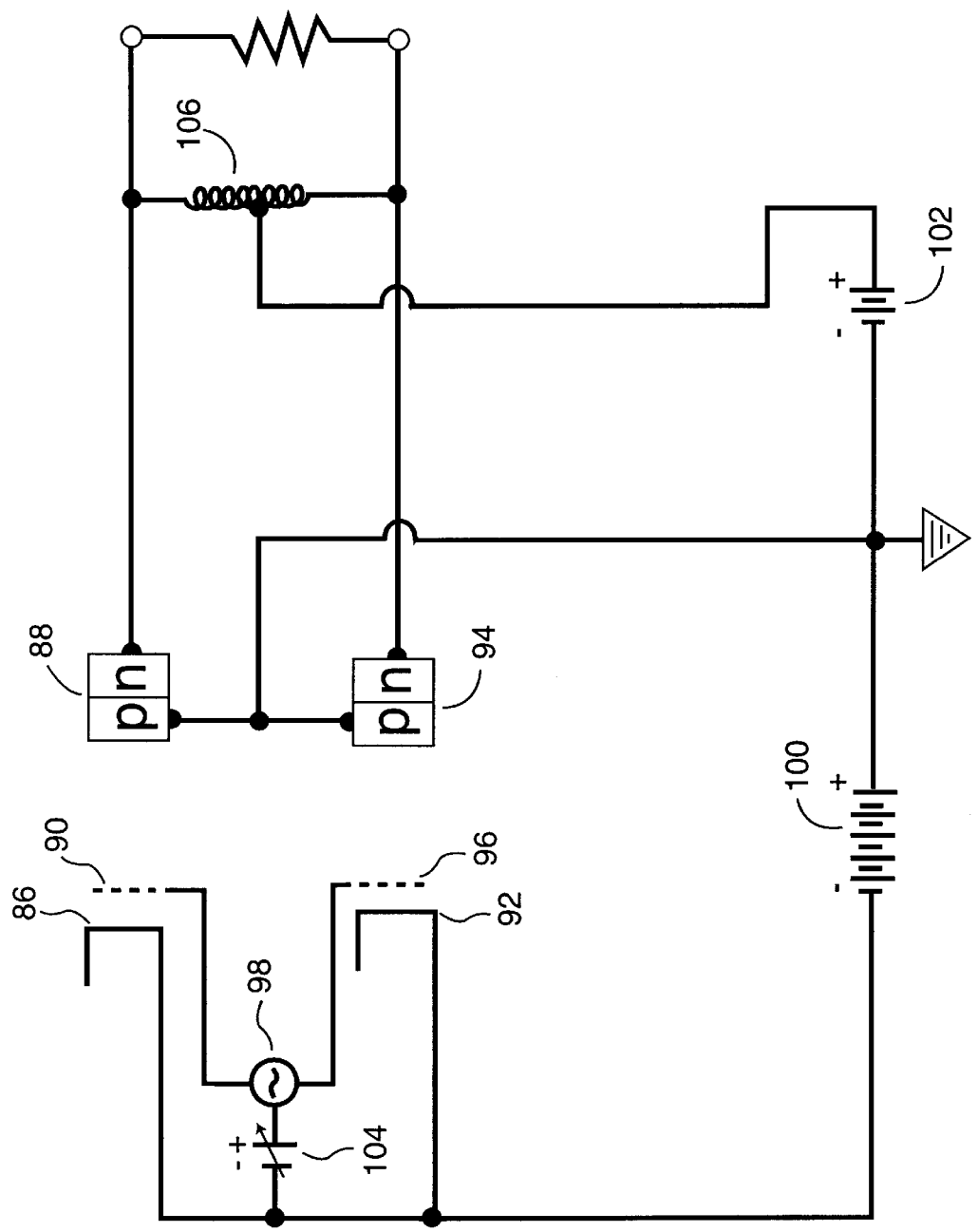
FIG. 9 is an electrical schematic showing the parallel GEISHA traveling wave amplifiers of FIG. 5, connected for class B push-pull operation.

Consider next the pairing of two GEISHA devices 82, 84, arranged parallel to each other as shown in FIG. 7 and connected electrically as shown in FIG. 9. The GEISHA devices 82, 84, may be the same as the GEISHA devices of FIG. 5 or FIG. 6. The GEISHA device 82 includes a stripline cathode 86, an stripline anode 88, and a control grid 90. The GEISHA device 84 includes a stripline cathode 92, an stripline anode 94, and a control grid 96.

The circuitry for the GEISHA devices 82, 84 is essentially the same as the circuitry for the GEISHA device shown in FIG. 5. The alternating input signal 98 to be amplified corresponds to the input signal 64 of FIG. 5. The acceleration voltage supply 100 corresponds to voltage supply 54 of FIG. 5, the anode reverse bias voltage supply 102 corresponds to voltage supply 56 of FIG. 5, and the variable voltage supply 104 corresponds to the variable voltage supply 62 of FIG. 5. Each half of the center-tapped inductor 106 corresponds to inductor 58 of FIG. 5.

Figure 8:
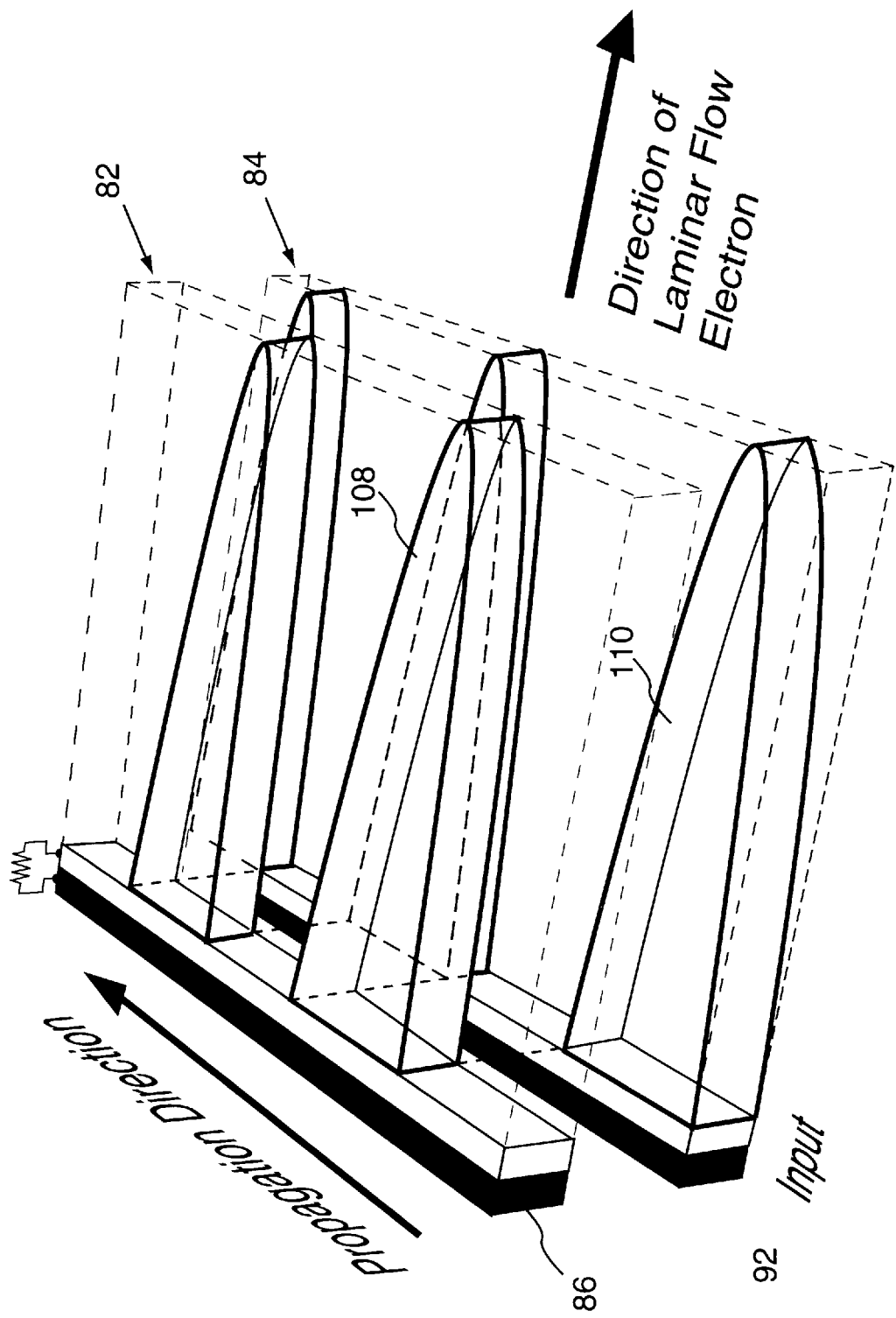
FIG. 8 shows the NEA semiconductor cathode striplines of FIG. 7 and the resultant electron beams for class B push-pull modulation.

As in the aforementioned class A device, both the stripline cathode and the stripline anode of each GEISHA device 82, 84 are designed such that their propagation velocities are equal. When the input signal 98 is fed to the two stripline cathodes 86, 92 with opposite polarities of an alternating current signal, then at any given length along the stripline cathodes 86, 92, the electron emission magnitude 108 along stripline cathode 86 will be the mathematical supplement of the electron emission magnitude 110 of stripline cathode 92, as illustrated in FIG. 8. Bias voltage source 104 is adjusted such that the control grids 90, 96 preclude any emission for zero or negative potentials of the input signal 98. At a position where the instantaneous signal level is maximum, the emission from one stripline cathode is maximum while the emission from the other stripline cathode will be totally cut off (e. g., zero). These positions of minima and maxima, of course, vary with applied input signal frequency and the propagation velocity. FIG. 9 depicts schematically how the devices are connected electrically. This is the basis of the highly efficient (78% theoretical) class B push-pull operation wherein even harmonics are intrinsically canceled. Operation is such that any incremental region of the emitting stripline cathode (when forward-biased) will emit electrons to the companion region in the output stripline anode and render that corresponding region conducting while an incremental region of the emitting stripline cathode that experiences the opposite polarity (by virtue of the traveling wave action and the input signal phase) will emit no electrons and thus enable the companion stripline anode incremental region to remain non-conductive.

Figure 10:
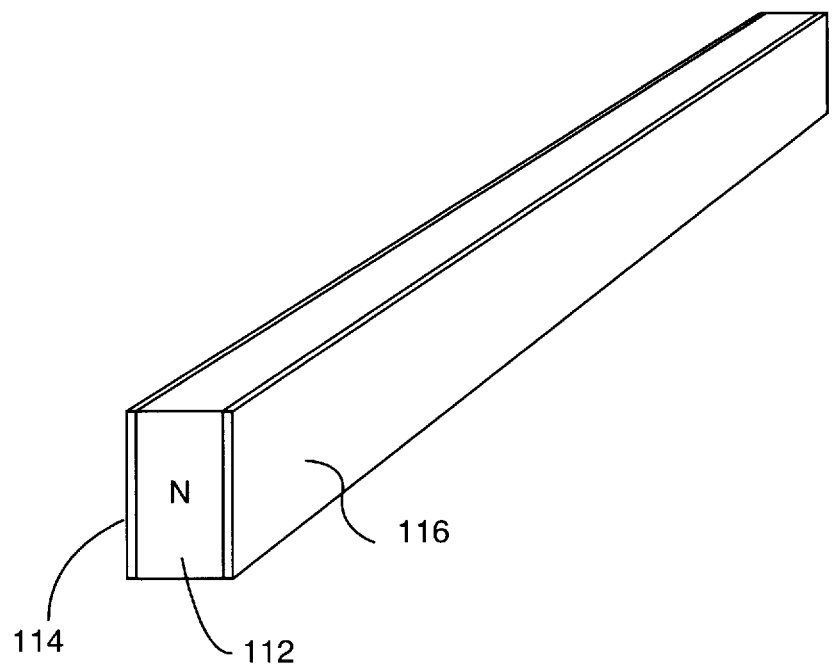
FIG. 10 shows a Schottky barrier stripline diode.

Each output stripline anode 88, 94 is shown as being comprised of a P-N junction. It can also be a Schottky barrier stripline diode, similar to that shown in FIG. 10, which has an N-type semiconductor layer 112 disposed between a thin metallic non-injecting contact 114 and a metallic ohmic contact 116. The non-injecting contact 114, which is bombarded by electrons emitted from the adjacent stripline cathode, is thin enough so as to have little effect on the electrons passing through it. Also, in the case of wide bandgap materials exhibiting extremely low leakage currents, each output stripline anode 88, 94 can be a layered metal/semiconductor/metal structure very similar to a classical stripline transmission line but wherein the insulator between the two conductors is a semiconductor exhibiting very high resistance until bombarded with energetic electrons.

Figure 11:
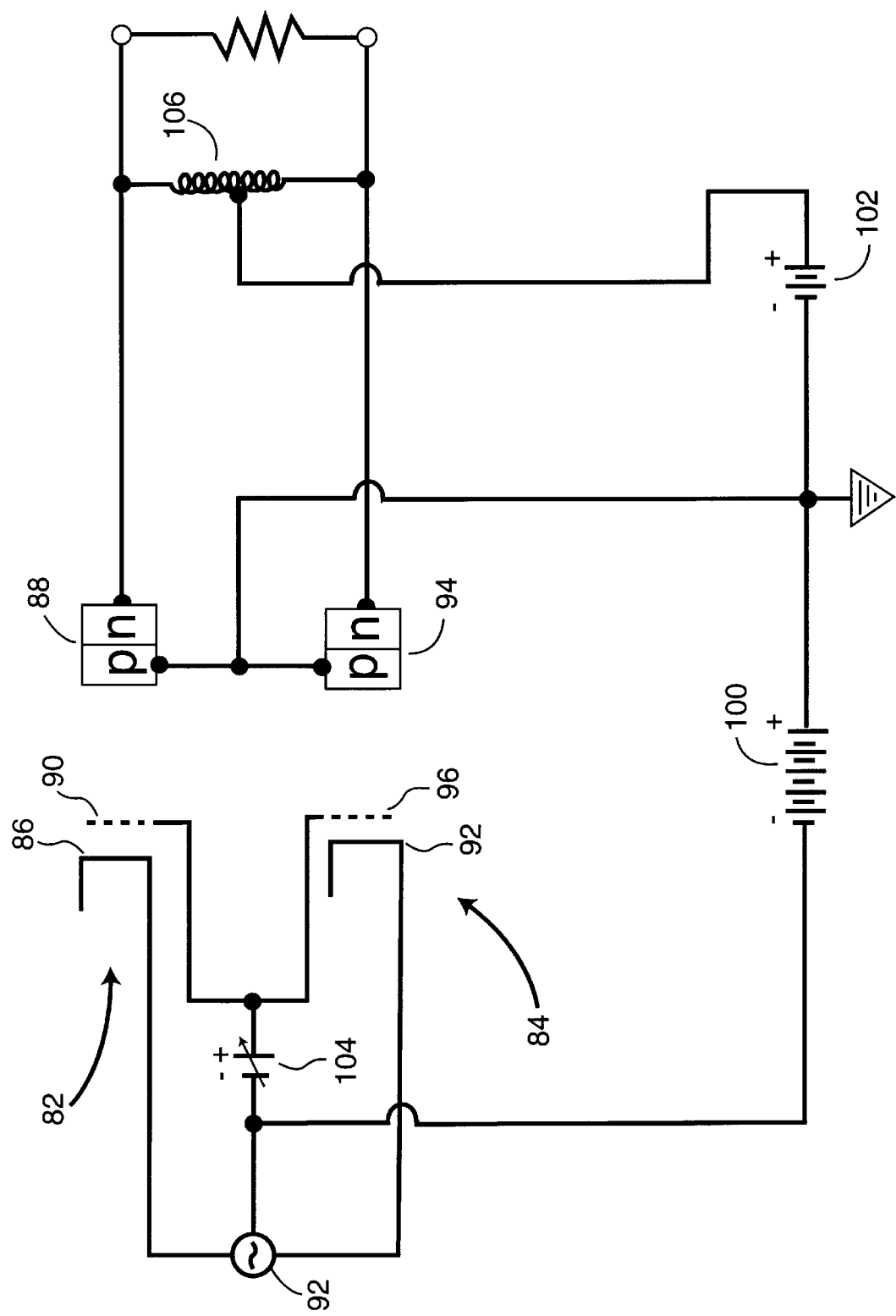
FIG. 11 is an alternate arrangement of the electrical schematic of FIG. 9.

The signal along each output stripline anode 88, 94 experiences a current density that is x times higher than the current density of the bombarding electron beam where x is the number of electron-hole pairs created by each effective (i. e., non-backscattered) incoming high energy electron. This value is approximately equal to the energy of the bombarding electron divided by 3 times the bandgap of the semiconductor used as the stripline anode target. In typical applications this is several thousand. When the P regions of the output stripline anode targets 88, 94 are at ground potential as shown here, there can be no Miller feedback capacitance and screen grids are not required in the electron gun structure. The actual output signal is taken between the two N regions of the output stripline anodes 88, 94 as shown schematically in FIG. 9. The voltage magnitude of this output signal (and hence voltage gain of the overall device) is a function of the anode reverse bias voltage 102. Whereas the current gain of the device is inversely proportional to the bandgap of the output anode targets 88, 94, the voltage gain of the device is proportional to the bandgap (if high bias voltages are used). An alternate arrangement, shown in FIG. 11, connects the control grids 90, 96 together and provides opposite polarities of the input signal 98 to the cathodes 86, 92. Since the high voltage electron beam requires no deflection modulation, the stripline anode targets 88, 94 can be placed in close proximity (e. g., 1 cm) to the traveling wave cathode electron gun structures 90, 96 with the primary requirement being to provide separation enough to prevent arcing and (in the case where the P regions of the anodes 88, 94 are not grounded) reduce Miller capacitance. This ability to reduce the size significantly (over that of previous deflection-structure-based devices) reduces the complexity of the device by virtually eliminating the complex structure required to form a laminar flow electron beam capable of being propagated a distance of many inches.

The simplicity of the configuration shown here compared to that of previous approaches is manifold. It is extremely broadband, exhibits exceptionally good linearity and is highly efficient (e. g., nearly 78%), but unlike previous traveling wave EBS/GEISHA devices, it does not require a laminar electron beam, it does not require an electron beam deflection structure, and with no input signal present it does not dissipate any power. Unlike other EBS devices employing a NEA cathode and class A operation, this device operates in a highly efficient, highly linear class B push-pull mode. Unlike previous traveling wave EBS/GEISHA devices, the propagation velocity along the output stripline anode target need not be critically matched to that in a deflection structure. When the traveling wave cathodes and the traveling wave output anode targets are of the same semiconductor material (e. g., AlN), then velocity matching becomes even simpler.

Unlike all other EBS/GEISHA devices, the present device can be operated not only in the highly linear class B, push-pull mode, but it can also be operated in an even more efficient (but reduced linearity) class C mode wherein electron emission (and output conduction) accrues only during the peak portions of the input signal. This class C operation is enabled by reducing the d.c. positive bias 104 on the input stripline cathodes 86, 92 to a level such that only the peaks of the input signal are sufficient to generate electron emission. During normal class B operation, the d.c. bias is adjusted to a point just lower than that required to initiate electron emission with no applied alternating current signal.

Since there are many variations, modifications, and additions to the invention described here which would be obvious to persons skilled in the art, it is intended that the scope of the invention be limited only by the appended claims.

What is claimed and desired to be secured by Letters Patent of the United States is:

1. A broadband traveling wave amplifier which comprises a target anode and electron gun means for bombarding said anode with an electron beam having an amplitude proportional to the amplitude of an input signal to be amplified, characterized in that:

the electron gun means comprises a cold cathode which includes semiconductor material exhibiting negative electron affinity (NEA) and which is configured as an input strip transmission line, or input stripline, having an electron emitting surface, and a modulation structure for modulating the density of the electrons emitted from said electron emitting surface with said input signal to generate said electron beam; and said anode is configured as an output strip transmission line spaced from and extending parallel to the input stripline cathode, said output stripline anode having an electron bombarded surface facing the electron emitting surface of the input stripline cathode and said output stripeline anode exhibiting a phase velocity equal to the phase velocity of the input stripline cold cathode.

2. A broadband traveling wave amplifier, as described in claim 1, wherein said output stripline anode is a reverse-biased semiconductor P-N junction diode of wide bandgap semiconductor material having very high reverse bias voltage capability.

3. A broadband traveling wave amplifier, as described in claim 2, wherein the anode wide bandgap semiconductor material comprises as least one of the following wide bandgap semiconductor materials: silicon carbide, gallium nitride, aluminum nitride, and diamond.

4. An broadband traveling wave amplifier, as described in claim 1, whereby said output stripline anode is a reverse-biased Schottky barrier diode of wide bandgap semiconductor material having very high reverse bias voltage capability.

5. A broadband traveling wave amplifier, as described in claim 1, wherein said cold cathode NEA semiconductor material comprises at least one of the following NEA semiconductor materials: diamond, aluminum nitride, gallium aluminum nitride, and boron nitride.

6. A broadband traveling wave amplifier, as described in claim 1, wherein said input stripline cathode comprises a forward-biased P-N junction of NEA semiconductor material, and wherein the signal to be amplified is applied across said P-N junction.

7. A broadband traveling wave amplifier, as described in claim 1, wherein said input stripline cathode comprises a strip of N-type NEA semiconductor material and said modulation structure comprises an electrically conductive control grid adjacent to and spaced from said N-type NEA semiconductor material, and wherein the signal to be amplified is applied between the N-type NEA semiconductor material and the control grid.

8. A broadband traveling wave amplifier, as described in claim 1, wherein said input stripline cathode comprises a strip of $N^+$ type NEA semiconductor material and said modulation structure comprises an electrically conductive control grid adjacent to and spaced from said $N^+$ type NEA semiconductor material, and wherein the signal to be amplified is applied between the $N^+$ type, NEA semiconductor material and the control grid.

9. A broadband traveling wave amplifier, as described in claim 1, wherein said input stripline cathode comprises:

a semiconductor heterojunction formed by a first, N type, NEA semiconductor material having an indirect bandgap and a second NEA semiconductor material having a direct bandgap, wherein said indirect bandgap is wider than said direct bandgap, and said electron emitting surface is an outer surface of the direct bandgap NEA semiconductor material opposite said heterojunction; and said modulation structure comprises an adjacent electrically conductive control grid spaced from and extending over said electron emitting surface, wherein the signal to be amplified is applied between the N type NEA semiconductor material and the control grid.

10. A broadband traveling wave amplifier, as described in claim 1, wherein the maximum cross sectional dimension, of both the input stripline cathode and the output stripline anode, orthogonal to both the traveling wave propagation direction along the stripline and the direction of electron flow from the input stripline cathode to the output stripline anode, is less than 0.1 wavelength of the highest frequency intended for its operation.

11. A broadband traveling wave amplifiers as described in claim 1, which further comprises a screen grid disposed between the input stripline cathode and the output stripline anode which is biased to suppress Miller capacitance.

12. A broadband traveling wave amplifier which comprises a target anode and electron gun means for bombarding said anode with an electron beam having an amplitude proportional to the amplitude of an input signal to be amplified, characterized in that the electron gun means comprises:

a cold cathode, which is configured as an input strip transmission line, or input stripline, having an electron emitting surface, comprising a semiconductor heterojunction formed by a first, N type, NEA semiconductor material having an indirect bandgap and a second NEA semiconductor material having a direct bandgap, wherein the indirect bandgap is wider than the direct bandgap, and the electron emitting surface is an outer surface of the direct bandgap NEA semiconductor material opposite the heterojunction, wherein the first NEA semiconductor material comprises cubic boron nitride (cBN), and the second NEA semiconductor material comprises aluminum nitride (AlN); and a modulation structure for modulating the electron beam with said input signal, said modulation structure comprising an adjacent electrically conductive control grid spaced from and extending over said electron emitting surface, wherein the signal to be amplified is applied between the N type NEA semiconductor material and the control grid; and said anode is configured as an output strip transmission line spaced from and extending parallel to the input stripline cathode, said output stripline anode having an electron bombarded surface facing the electron emitting surface of the input stripline cathode, and said output stripline anode exhibiting a phase velocity equal to the phase velocity of the input stripline cathode.

13. A broadband traveling wave amplifier, as described in claim 12, wherein the first NEA semiconductor material comprises $N^+$ doped cubic boron nitride (cBN), and the second NEA semiconductor material comprises N type, aluminum nitride (AlN).

14. A broadband, traveling wave, push pull, amplifier assembly, which comprises:

first and second broadband traveling wave amplifiers, having essentially identical characteristics, each amplifier comprising a target anode and electron gun means for bombarding said anode with an electron beam having an amplitude proportional to the amplitude of an input signal, the two electron guns means being supplied with opposite polarities of an alternating input signal to be amplified, wherein said electron gun means comprises (1) a cold cathode which includes semiconductor material exhibiting negative electron affinity (NEA) and which is configured as an input strip transmission line, or input stripline, having an electron emitting surface, and (2) a modulation structure for modulating the density of the electrons emitted from said electron emitting surface with said input signal to generate said electron beam, and wherein said anode is configured as an output strip transmission line spaced from and extending parallel to the input stripline cathode, said output stripline anode having an electron bombarded surface facing the electron emitting surface of the input stripline cathode, and said output stripline anode exhibiting a phase velocity equal to the phase velocity of the input stripline cathode; and an adjustable d.c. bias voltage supply means for providing a d.c. positive bias to the modulation structure relative to the input stripline cathode of both electron gun means, to preclude any electron emission for zero or negative potentials of the alternating input signal to be amplified;

wherein the two output stripline anodes are connected in an output circuit such that said amplifier assembly operates in a push-pull mode.

15. A broadband, traveling wave, push pull, amplifier assembly, as described in claim 14, wherein said d.c. bias of the two modulating structures is adjusted to a point just lower than that required to initiate electron emission with no applied alternating input signal, whereby said amplifier assembly operates in a highly linear, class B, push-pull mode.

16. A broadband, traveling wave, push pull, amplifier assembly, as described in claim 14, wherein said d.c. positive bias of the two modulating structures is reduced to a level such that only the peaks of the alternating input signal are sufficient to generate electron emission, whereby said amplifier assembly operates in a highly efficient, class C, push-pull mode.

17. A broadband, traveling wave, push pull, amplifier assembly, as described in claim 14, wherein said opposite polarities of the alternating input signal are supplied respectively to the two modulating structures.

18. A broadband, traveling wave, push pull, amplifier assembly, as described in claim 14, wherein said opposite polarities of the alternating input signal are supplied respectively to the input stripline cathodes.

19. A broadband, traveling wave, push pull, amplifier assembly, as described in claim 14, wherein each output stripline anode comprises a reverse-biased diode of wide bandgap semiconductor material.

20. A broadband, traveling wave, push pull, amplifier assembly, as described in claim 19, wherein the anode wide bandgap semiconductor material comprises at least one of the group of materials consisting of silicon carbide, gallium nitride, aluminum nitride, and diamond, and wherein the cold cathode NEA semiconductor material comprises at least one of the group of materials consisting of diamond, aluminum nitride, gallium aluminum nitride, and boron nitride.

* * * * *